(12) United States Patent  (10) Patent No.: US 7,637,778 B2
Sakai  (45) Date of Patent: Dec. 29, 2009

(54) BOARD-MOUNTED TYPE CONNECTOR TO WHICH A SHIELD PLATE IS ATTACHED

(75) Inventor: Shuhei Sakai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 122 days.

(21) Appl. No.: 11/671,707

(22) Filed: Feb. 6, 2007

(65) Prior Publication Data

US 2008/0102663 A1  May 1, 2008

(30) Foreign Application Priority Data

Oct. 26, 2006 (JP) .............................. 2006-291200

(51) Int. Cl.
*H01R 13/648* (2006.01)
(52) U.S. Cl. ................. 439/607.4; 439/607.54
(58) Field of Classification Search ................ 439/607, 439/108, 609, 607.01, 607.35, 607.4, 607.54; 361/800, 816, 818
See application file for complete search history.

(56) References Cited

U.S. PATENT DOCUMENTS 5,500,788 A * 3/1996 Longueville et al. ........ 439/108

6,648,687 B2 * 11/2003 Otto et al. ................... 439/607

FOREIGN PATENT DOCUMENTS

| JP | 63-158778 A | 7/1988 |
|----|-------------|--------|
| JP | 4-95376 A | 3/1992 |

* cited by examiner

*Primary Examiner*—Felix O Figueroa
(74) *Attorney, Agent, or Firm*—Westerman, Hattori, Daniels & Adrian, LLP (57) ABSTRACT

A shield plate arranged between a connector and a circuit board for covering and shielding parts of metal pins sticking out from the circuit board when a connector provided with a board mounting surface having a plurality of metal pins and a connector connection surface is mounted at an end of the circuit board, provided with an connector-engagement part, a shield part of the metal pins, a mounting part having press-fit pins for insertion, and support parts of the press-fit pins and flexible parts at a part between the shield part and the mounting part, the press-fit pins becoming vertical to the circuit board in the state with the engagement part engaged with the connector and the free end parts of the press-fit pins provisionally inserted into the engagement holes, thereby enabling the press-fit pins to be press-fit into the engagement holes all at once by a pushing action of the support parts.

6 Claims, 11 Drawing Sheets

RELATED ART

BOARD-MOUNTED TYPE CONNECTOR TO WHICH A SHIELD PLATE IS ATTACHED

CROSS-REFERENCE TO RELATED APPLICATION

This application claims priority from, and incorporates by reference the entire disclosure of, Japanese Patent Application No. 2006-291200, filed on Oct. 26, 2006.

BACKGROUND OF THE INVENTION

1. Field of the Invention

The present invention relates to a board-mounted type connector to which a shield plate is attached. The present invention particularly relates to a connector mounted on a plug-in type circuit board housed in large numbers in an optical transmission system or other large-scale control system and the structure of a shield plate attached between this connector and circuit board.

2. Description of the Related Art

In recent years, the means for transmission of telephone and Internet information has been shifting from electrical signals to optical signals. An optical transmission system converts as input optical signal to an electrical signal, then amplifies it and reconverts it to an optical signal for transmission to a remote base station. An optical transmission system houses a large number of circuit boards, on which electrical devices are mounted, in the form of plug-in units able to be plugged into the system frame by connectors.

A plug-in unit is configured by mounting ICs forming control circuits or other electronic circuit parts on a circuit board by automatic insertion or another means, then mounting the connectors and electrically connecting them by solder etc. The connectors mounted on a circuit board include an optical connector which receives optical signals and convert them to electrical signals for transfer to the circuits on the circuit board and an electrical connector which transfer electrical signals on the circuit board to other plug-in units in the system (hereinafter, electrical connectors simply referred to as "connectors").

A connector connects a plug-in unit to a connector provided on the frame. Usually, the frame side connector is a male connector, while the plug-in unit side is a female connector. Further, as explained above, a connector transfers electrical signals on the circuit board to another plug-in unit in the system. It is plugged into a male connector provided on the frame, so usually is mounted on an end of the circuit board and fastened by solder.

A plurality of plug-in units are housed in an optical transmission system. Each plug-in unit is comprised of a circuit board on which a connector and optical connector are provided. The connector is connected to a connector provided on the frame of the optical transmission system. A plurality of plug-in units are housed in the frame oriented in the vertical direction. The sections housing the plug-in units are called "shelves".

The circuit board of each plug-in unit mounts electronic devices including a large number of integrated circuits (LSIs and ICs) forming electronic circuits. Further, one end of the circuit board has a connector attached to it, while the opposite end has an optical connector attached to it. A connector often has a shield plate attached to it covering the top surface and back surface of the connector.

A connector requires a shield plate in general to shield adjoining transmission paths and prevent adjoining transmission paths from affecting each other or to prevent an outside electromagnetic waves from being received at a terminal of the connector and unnecessary signals from entering a transmission path in a connector performing high speed transmission of electrical signals. There have been various configurations of shield plates in the past. For example, as a shield plate designed to prevent adjoining transmission paths from affecting each other, FIG. 1 of Japanese Patent Publication (A) No. 2002-231390 discloses ones shielding adjoining connection terminals (contacts). Further, in the shielded connector assembly described in this prior art patent, the contacts as a whole are covered by a metal rear shell.

The back surface of a circuit board of a plug-in unit usually is not provided with any electronic devices. On the other hand, the connector provided at an end of a circuit board is attached from the front surface of the circuit board. Therefore, the mounting pins of the connector to the connector stick out from the rear side of the circuit board. Accordingly, the rear side of the circuit board has a shield plate attached to it to shield the mounting pins of the connector. Here, the structure of a connector attached to a circuit board and a shield plate attached between a connector and rear surface of a circuit board for shielding the mounting pins of the connector will be explained.

The case of a board-mounted type connector attached from the front surface of a circuit board where electronic devices are mounted will be explained. A connector has an insulating housing. This insulating housing has a board mounting surface, step difference surface, shield plate engagement surface, male connector connection surface, two side surfaces, a top surface, and a back surface.

The board mounting surface is provided with metal pins, sticking out from it in a dot matrix, for passing through a large number of mounting holes provided at an end of the top of the circuit board. The mounting holes have not shown circuit patterns connected to them. The step difference surface is perpendicular to this board mounting surface and has a height (step difference) of at least a thickness of the circuit board. The shield plate engagement surface adjoins the step difference surface and is formed parallel to the board mounting surface. When the shield plate engagement surface has a tapered surface inclined toward the male connector connection surface side, the step difference part formed at a terminal end of the tapered surface is provided with engagement holes running through the male connector connection surface side. The male connector connection surface is a surface parallel to the step difference surface and is provided with the same number of openings as the metal pins. The openings are provided deep inside them with female connector parts for electrical connection with the metal pins.

The shield plate attached between the shield plate engagement surface of a connector and the circuit board after this connector is attached to the circuit board is made of metal and is provided with an engagement part to be engaged with a shield plate engagement surface of a connector, a shield part for shielding metal pins sticking out from the circuit board, and a mounting part provided with press-fit pins fastened by insertion into engagement holes provided in the circuit board.

The engagement part has a smaller thickness. Engagement tabs for insertion into engagement holes running from the shield plate engagement surface side of the connector to the male connector connection surface are provided at a free end of the engagement part. The distance between engagement tabs is equal to the distance between engagement holes. Further, the engagement part is provided at its center part with a plurality of holes for lightening the weight of the connector and securing flexibility of the engagement part. The tapered surface of the connector may also be provided with projections corresponding to these holes. Further, instead of the tapered surface, the shield plate engagement surface may also be provided with a simple recess.

The shield part is a flat plate with a large thickness and is provided with an area covering the metal pins sticking out from the circuit board. The mounting part is provided perpendicular to the shield part. The free end side is provided with press-fit pins at predetermined distances. The press-fit pins have sharp free end parts, but the parts following the free end parts are formed as bulging parts. These bulging parts have widths larger than the diameters of the engagement holes provided in the circuit board. Due to the bulging parts, the press-fit pins can be fastened in the engagement holes.

When attaching the shield plate between the connector and circuit board, first the engagement tabs of the free end part of the engagement part of the shield plate are passed through the engagement holes running from the shield plate engagement surface side to the male connector connection surface, then the press-fit pins provided at the end of the mounting part are inserted into the engagement holes provided in the circuit board.

When inserting the engagement tabs of the free end part of the shield plate in the engagement holes, then press-fitting the press-fit pins provided at the free end side of the mounting part into the engagement holes, the pushing jig is positioned above the press-fit pins of the shield plate and the press-fit pins are pushed by the pushing jig.

However, in the prior art, in the state with the free end part of a press-fit pin provisionally inserted into an engagement hole, there was a deviation (difference in angle) between the axial line of the press-fit pin and the axial line (vertical to the circuit board) of the engagement hole (the engagement hole being a through hole copper plated on the part on the circuit board and the inside circumference). That is, the axial line of the press-fit pin is not vertical to the circuit board, so if vertical direction force is applied all at once in this state, the force will disperse resulting in deformation of the shield plate or force being applied rotating the press-fit pin while the press-fit pin is inserted into the engagement hole, so the press-fit pin will buckle or other press-fit defects will occur and a problem will arise in quality.

As a method for press-fitting press-fit pins into engagement holes so that this problem does not occur, there is the method of dividing the pressing action against the press-fit pins 44 into several actions to disperse the pushing force, but with this method, there are the problems that the time for press-fitting the press-fit pins in the engagement holes becomes longer and the number of circuit boards produced per unit time ends up being reduced.

SUMMARY OF THE INVENTION

An object of the present invention is to provide a shield plate of a board-mounted type connector free of deviation between axial lines of press-fit pins and axial lines of engagement holes in the state where free end parts of press-fit pins of the shield plate are provisionally inserted into engagement holes on a circuit board and enabling press-fit pins to be press-fit all at once in the circuit board in the state where no press-fit defects occur when press-fitting the shield plate between the connector attached to a circuit board and the circuit board and a board-mounted type connector to which a shield plate is attached.

To achieve the above object, according to one aspect of the present invention, there is provided a shield plate of a board-mounted type connector provided with a board mounting surface provided with metal pins sticking out for insertion into mounting holes of a circuit board, a shield plate engagement surface formed in parallel with the board mounting surface separated from it by a step difference of at least a thickness of the circuit board, and a male connector connection surface adjoining the shield plate engagement surface, which shield plate is attached between the connector and circuit board after the connector is mounted to the circuit board and is provided with an engagement part to be engaged with the shield plate engagement surface, a shield part for shielding pins sticking out from the circuit board, a mounting part provided with press-fit pins to be inserted in and engaged with engagement holes provided in the circuit board, pin support parts provided at a boundary of the shield part and mounting part and supporting the press-fit pins vertical to the circuit board when the engagement part is engaged with the shield plate engagement surface in the state with the shield part inclined with respect to the circuit board, and flexible parts provided near the pin support parts and deforming so that the shield part approaches the board surface by a pushing action after the press-fit pins are engaged in the engagement holes by the pushing action.

Further, to achieve the above object, according to another aspect of the invention, there is provided a board-mounted type connector provided with an insulating housing having a board mounting surface for mounting on an end of a circuit board and provided with conductive pins sticking out for insertion into a plurality of mounting holes provided in the circuit board, a step difference surface connected with one side of the board mounting surface perpendicular to the height direction of the pins, a shield plate engagement surface adjoining a side of the step difference surface opposite to the one side, and a male connector connection surface provided with an insertion opening for connecting a male connector with a female connector part for electrical connection to the pins and provided parallel with the step difference surface, the step difference surface having a height higher than a thickness of the circuit board, and the shield plate engagement surface is provided with an engagement part bridged between this connector and the board after this connector is mounted on the circuit board and engaging with one end of a metal shield plate covering and shielding the tops of the pins sticking out from the board.

According to the present invention, when press-fitting a shield plate between a connector attached to a circuit board and the circuit board, there is no deviation between the axial lines of the press-fit pins and the axial lines of the engagement holes in the state with the free end parts of the press-fit pins of the shield plate provisionally inserted into engagement holes on the circuit board and it is possible to press-fit the press-fit pins into the circuit board 1 all at once in the state with no press-fit defects, so the time for press-fitting the press-fit pins into the engagement holes can be shortened and the number of circuit boards produced per unit time can be increased.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before describing the preferred embodiments, an explanation will be given of the conventional connector and shield plate shown in FIGS. 1 to 7C.

Figure 1:
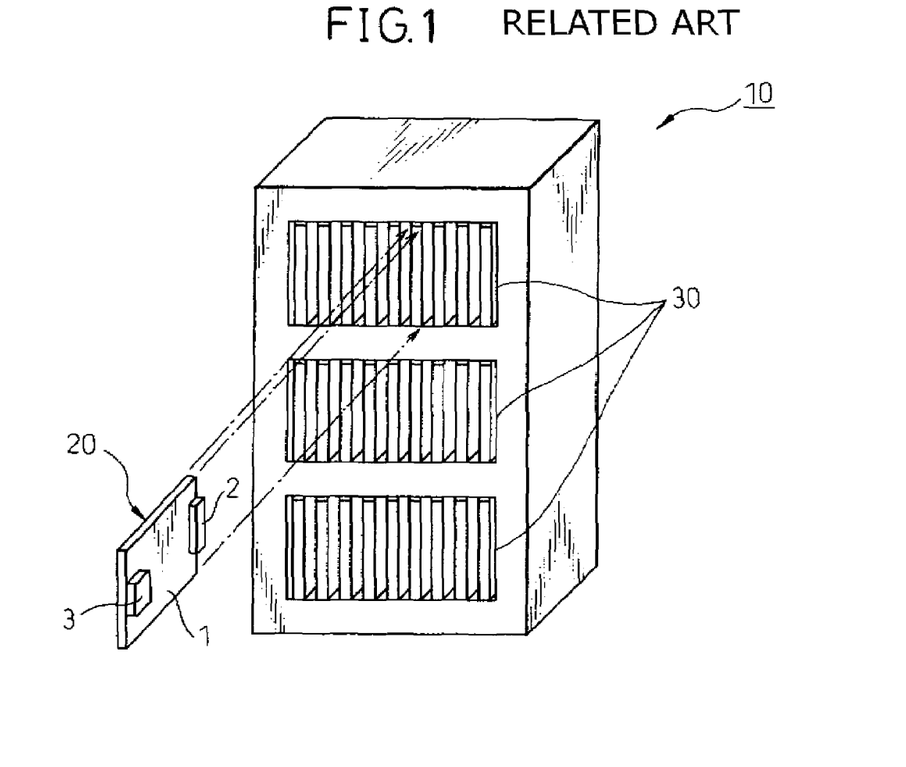
FIG. 1 is a perspective view showing the appearance of a conventional optical transmission system and a plug-in unit housed in this system.

FIG. 1 is a perspective view showing the appearance of an optical transmission system 10 and a plurality of plug-in units 20 housed in the optical transmission system 10. Each plug-in unit 20 is comprised of a circuit board 1 on which a connector 2 and an optical connector 3 are provided. The connector 2 is connected to a connector (not shown) provided at a frame of the optical transmission system 10. A plurality of the plug-in units 20 are housed in the frame oriented in the vertical direction. The sections housing the plug-in units 20 are called "shelves".

Figure 2:
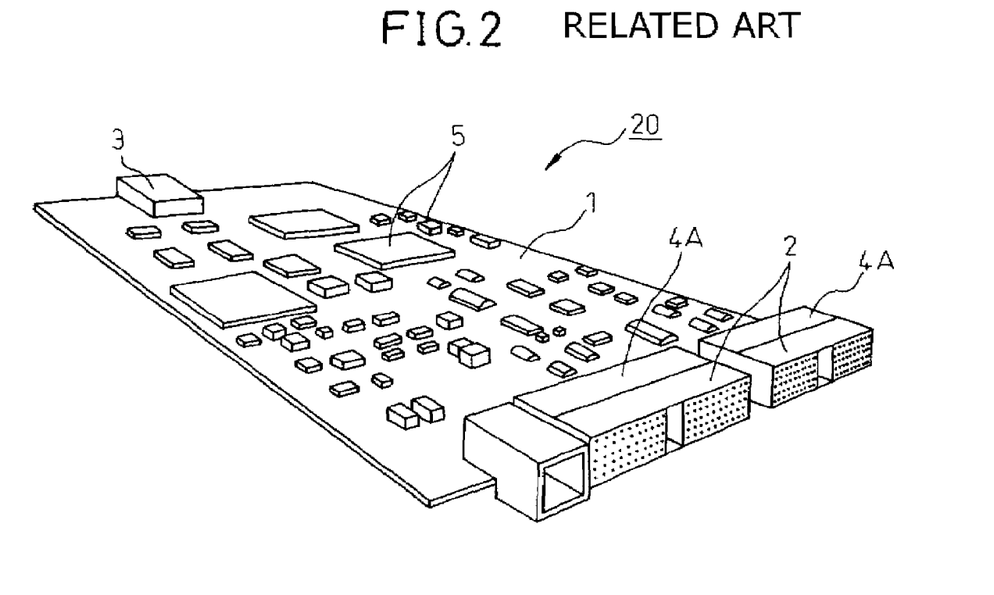
FIG. 2 is a perspective view showing a front surface of an example of the plug-in unit shown in FIG. 1.

FIG. 2 is a perspective view showing a surface of an example of a plug-in unit 20. The plug-in unit 20 has a circuit board 1 on which a large number of electronic devices 5 including integrated circuits (LSIs or ICs) forming electronic circuits are mounted. Further, the circuit board 1 has connectors 2 attached to it at one end and has an optical connector 3 attached to it at its opposite end. In this example, the circuit board 1 has two connectors 2 attached to one end. The connectors 2 usually have shield plates 4A attached to them covering the top surfaces and back surfaces of the connector 2.

Figure 3:
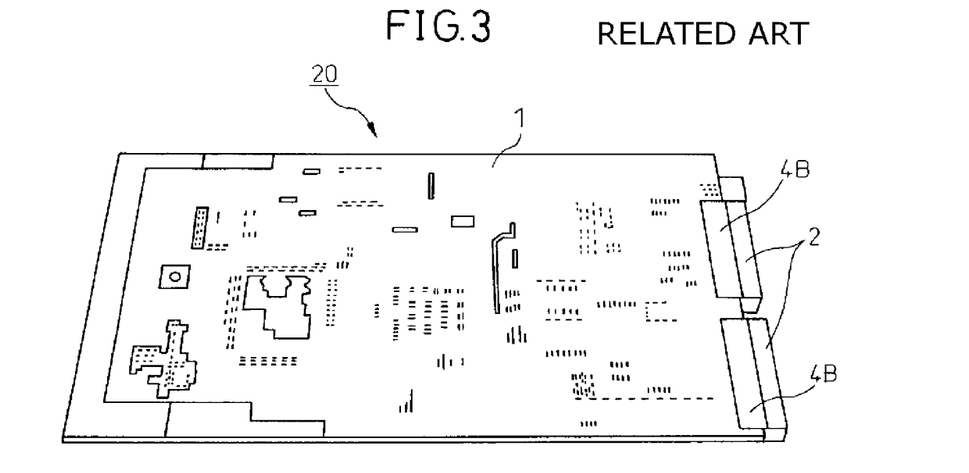
FIG. 3 is a perspective view showing a rear surface of an example of the plug-in unit shown in FIG. 1.

FIG. 3 is a perspective view showing the rear surface of the plug-in unit 20 shown in FIG. 2. The circuit board 1 is not provided with any electronic devices on its rear surface. On the other hand, the connectors attached to the end of the circuit board 1 are attached from the front side of the circuit board 1, so the mounting pins of the connectors 2 to the circuit board 1 stick out from the rear surface of the circuit board 1. Therefore, the rear surface of the circuit board 1 has shield plates 4B attached to it so as to shield the mounting pins of the connectors 2. Here, the structures of the connectors 2 attached to the circuit board 1 and the shield plates 4B attached between the connectors 2 and the circuit board 1 for shielding the mounting pins of the connectors 2 will be explained.

Figure 4:
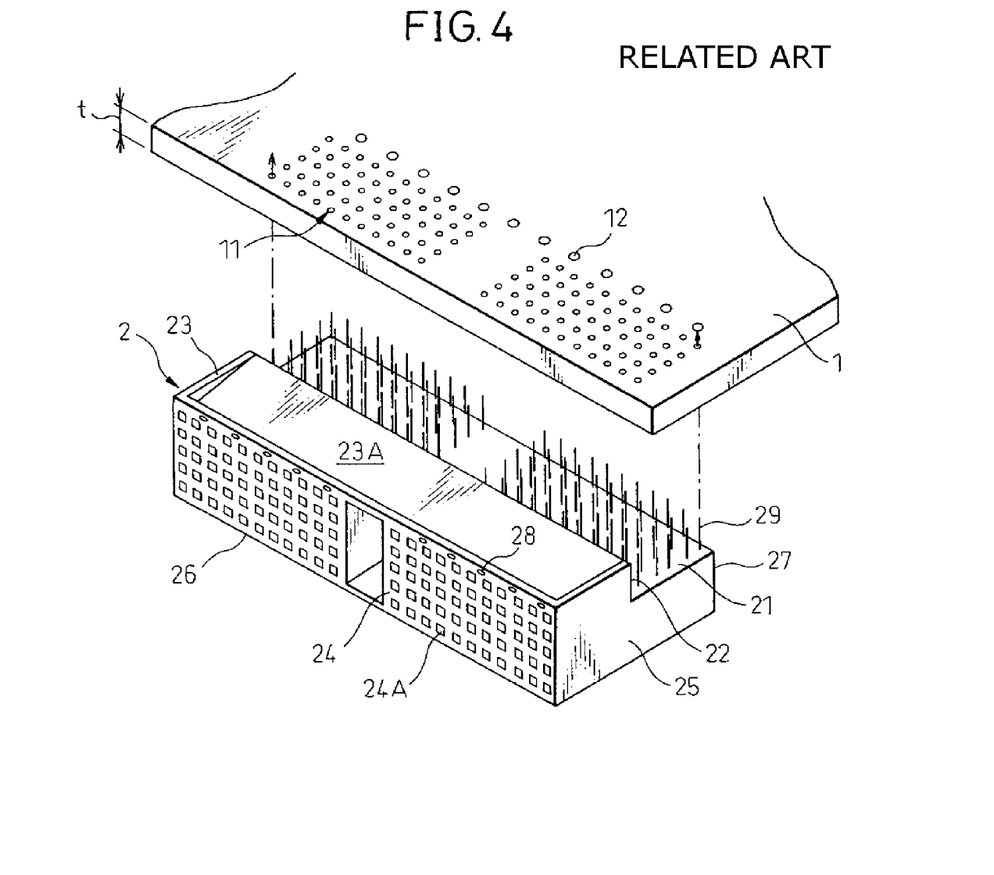
FIG. 4 is an assembled perspective view showing the process of attaching a connector 2 to a circuit board 1.

FIG. 4 is an assembled perspective view showing the process of attaching a board-mounted type connector 2 to a circuit board 1 from the front side where electronic devices are mounted. The connector 2 has an insulating housing. This insulating housing has a board mounting surface 21, step difference surface 22, shield plate engagement surface 23, male connector connection surface 24, two side surfaces 25, a top surface 26, and a back surface 27.

The board mounting surface 21 is provided with metal pins 29, sticking out from it in a dot matrix, for passing through a large number of mounting holes 11 provided at an end of the top of the circuit board 1. The mounting holes 11 have not shown circuit patterns connected to them. The step difference surface 22 is perpendicular to this board mounting surface 21 and has a height (step difference) of at least a thickness t of the circuit board 1. The shield plate engagement surface 23 adjoins the step difference surface 22 and is formed parallel to the board mounting surface 21. The shield plate engagement surface 23 of this example has a tapered surface 23A inclined toward the male connector connection surface 24 side. The step difference part formed at a terminal end of the tapered surface 23A is provided with engagement holes 28 running through the male connector connection surface 24 side. The male connector connection surface 24 is a surface parallel to the step difference surface 22 and is provided with the same number of openings 24A as the metal pins 29. The openings 24A are provided deep inside them with female connector parts for electrical connection with the metal pins 29.

Figure 5A:
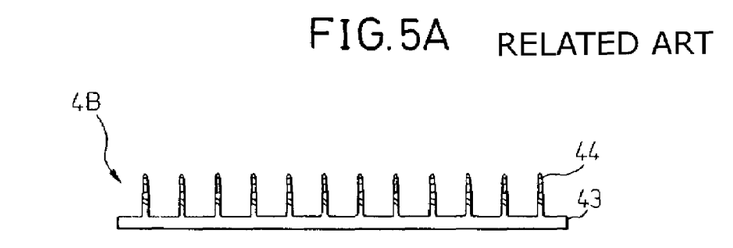
FIG. 5A is a front view showing the configuration of a conventional shield plate attached between a shield plate engagement surface of a connector and a circuit board after the connector shown in FIG. 4 is attached to the circuit board.
Figure 5B:
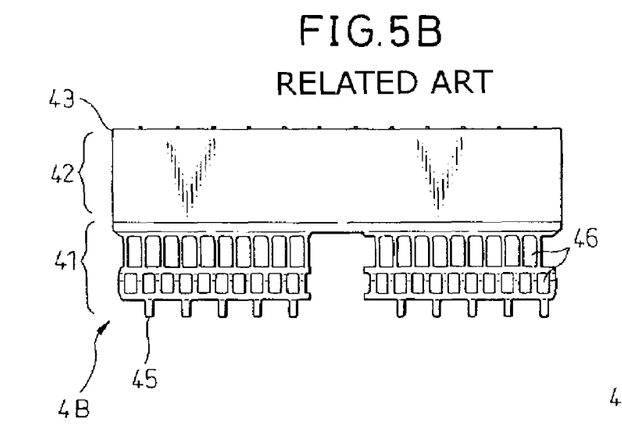
FIG. 5B is a plan view of a shield plate shown in FIG. 5A.
Figure 5C:
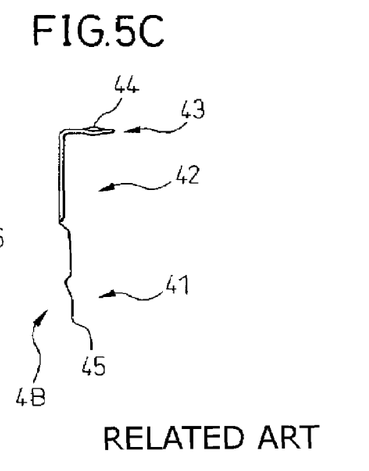
FIG. 5C is a side view of the shield plate shown in FIG. 5A.

FIGS. 5A, 5B, and 5C are a front view, plan view, and side view showing the configuration of a shield plate 4B after the connector 2 shown in FIG. 4 is attached to the circuit board 1. The shield plate 4B is made of metal and is provided with an engagement part 41 for engagement with the shield plate engagement surface 23 of the connector 2, a shield part 42 for shielding the metal pins 29 sticking out from the circuit board 1, and a mounting part 43 provided with press-fit pins 44 fastened by insertion into the engagement holes 12 provided at the circuit board 1 (see FIG. 4).

The engagement part 41 has a smaller thickness. Engagement tabs 45 for insertion into engagement holes 28 running from the shield plate engagement surface 23 side of the connector 2 to the male connector connection surface 24 are provided at a free end of the engagement part 41. The distance between engagement tabs 45 is equal to the distance between engagement holes 28. Further, the engagement part 41 is provided at its center part with a plurality of holes 46 for lightening the weight of the connector 2 and securing flexibility of the engagement part 41. The tapered surface 23A of the connector 2 may also be provided with projections corresponding to these holes 46. Further, instead of the tapered surface 23A, the shield plate engagement surface 23 may also be provided with a simple recess.

The shield part 42 is a flat plate with a large thickness and is provided with an area covering the metal pins 29 sticking out from the circuit board 1. The mounting part 43 is provided perpendicular to the shield part 42. The free end side is provided with press-fit pins 44 at predetermined distances. The press-fit pins 44 have sharp free end parts, but the parts following the free end parts are formed as bulging parts. These bulging parts have widths larger than the diameters of the engagement holes 12 provided in the circuit board 1. Due to the bulging parts, the press-fit pins 44 can be fastened in the engagement holes 12.

Figure 6A:
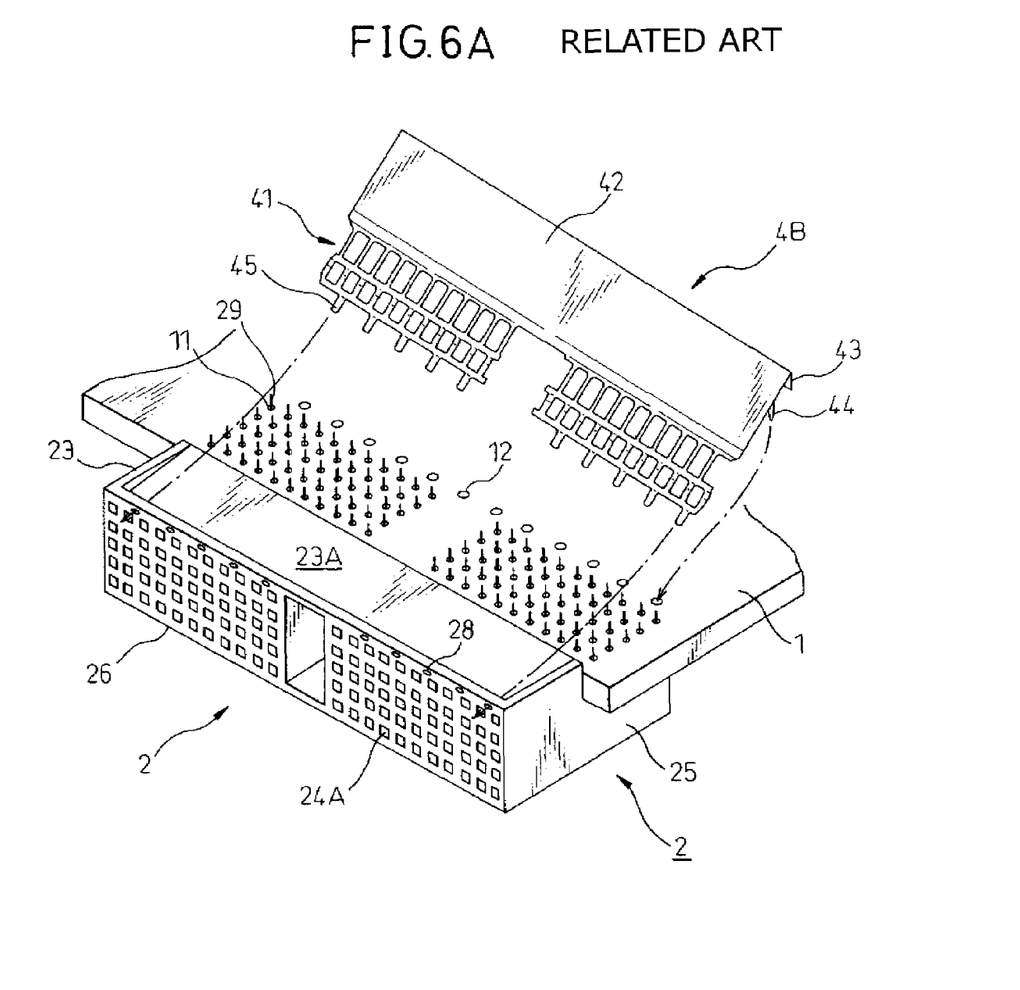
FIG. 6A is an assembled perspective view showing the process of attaching the shield plate shown in FIGS. 5A to 5C between a connector already attached to an end of the circuit board and the circuit board.

FIG. 6A is an assembled perspective view showing a process for attaching the shield plate 4B shown in FIGS. 5A to 5C between a connector 2 already attached to an end of a circuit board 1 and the circuit board 1 to complete the circuit board 1. When attaching the shield plate 4B between the connector 2 and circuit board 1, first the engagement tabs 45 of the free end part of the engagement part 41 of the shield plate 4B are passed through the engagement holes 28 running from the shield plate engagement surface 23 side to the male connector connection surface 24, then the press-fit pins 44 provided at the end of the mounting part 43 are inserted into the engagement holes 12 provided in the circuit board 1.

Figure 6B:
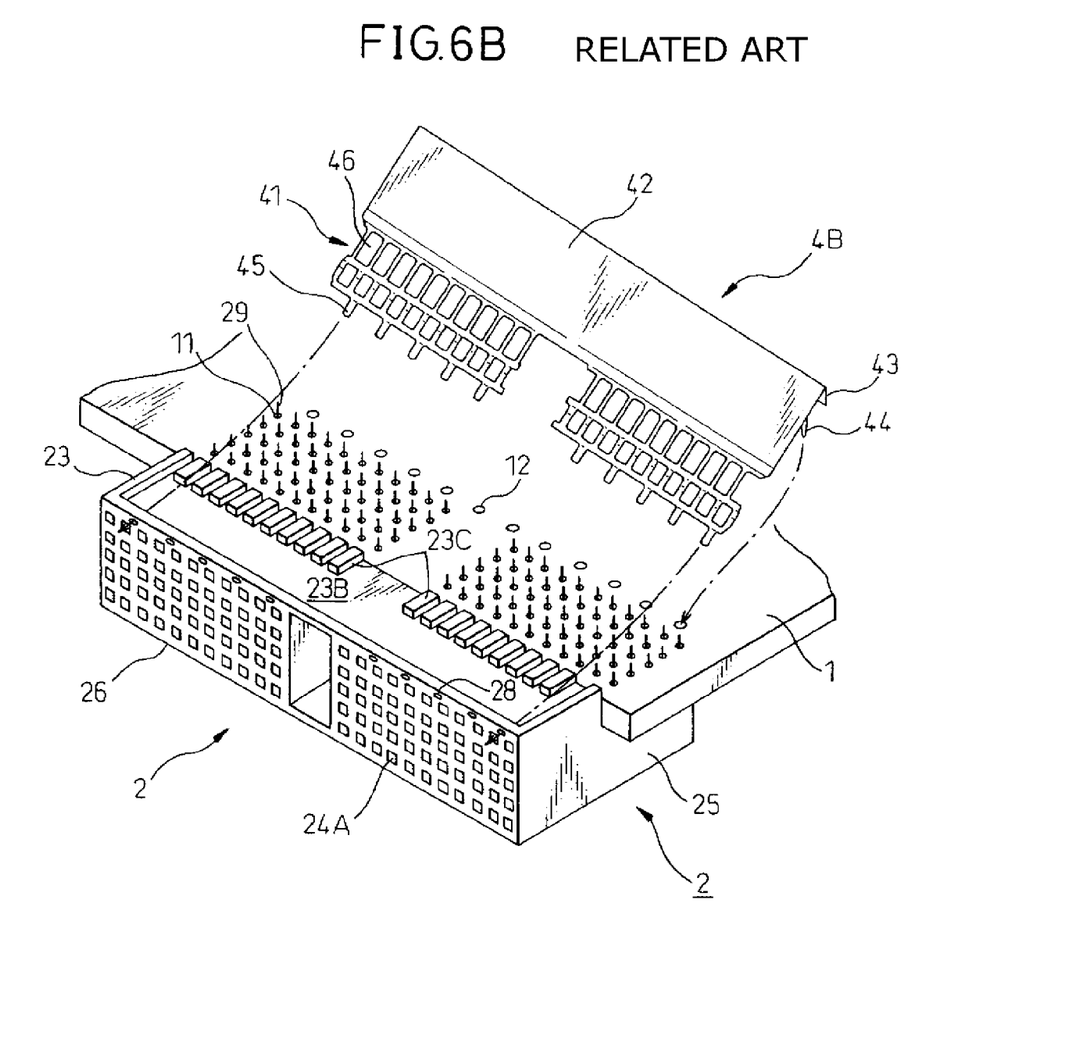
FIG. 6B is an assembled perspective view showing the process of attaching the shield plate shown in FIGS. 5A to 5C between a connector of another embodiment already attached to an end of the circuit board and the circuit board.

FIG. 6B is also an assembled perspective view showing the process of attaching the shield plate 4B shown in FIGS. 5A to 5C between a connector 2 already attached to an end of a circuit board 1 and the circuit board 1 to complete the circuit board 1. The embodiment shown in FIG. 6B differs from the embodiment shown in FIG. 6A only on the point of the shape of the shield plate engagement surface 23 of the connector 2. In the embodiment shown in FIG. 6A, the shield plate engagement surface 23 of the connector 2 forms a tapered surface 23A, but in the embodiment shown in FIG. 6B, the shield plate engagement surface 23 is formed with a simple recess 23B. This recess 23B is provided with projections 23C corresponding to the holes 46 of the shield plate 4B. In this embodiment, the engagement tabs 45 and holes 46 enable reliable positioning of the shield plate 4B.

Figure 7A:
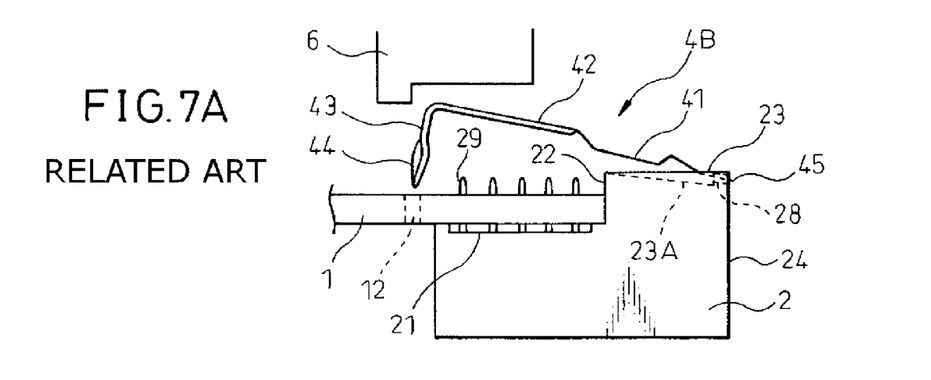
FIG. 7A is a side view of the state right before the press-fit pins of the free end part of the mounting part of the shield plate shown in FIG. 6 are inserted into engagement holes of the circuit board as seen from the side surface.

FIG. 7A shows the state right before the press-fit pins 44 sticking out from the free end side of the mounting part 43 are inserted into engagement holes 12 of the circuit board 1 as seen from the side surface after the engagement tabs 45 of the free end part of the shield plate 4B shown in FIG. 6 are inserted into the engagement hole 28. The press-fit pins 44 are press-fit into the engagement holes 12 by positioning a pushing jig 6 above the press-fit pins 44 of the shield plate 4B and pushing the press-fit pins 44 by the pushing jig 6.

Figure 7B:
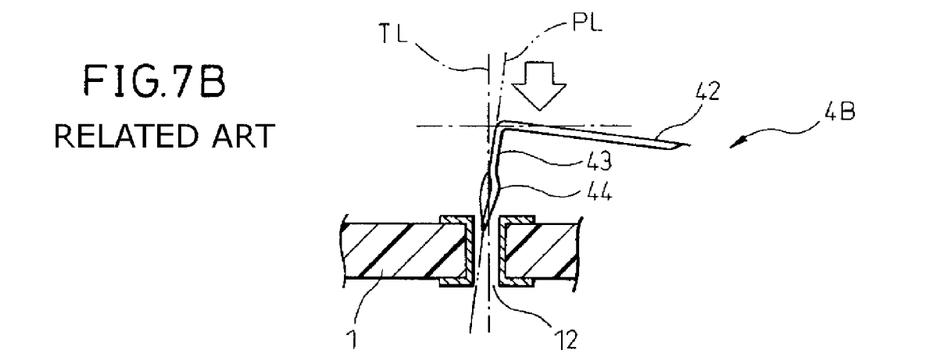
FIG. 7B is an explanatory view for explaining the state where there is deviation between the axial line of an engagement tab in FIG. 7A and an axial line of the engagement hole.
Figure 7C:
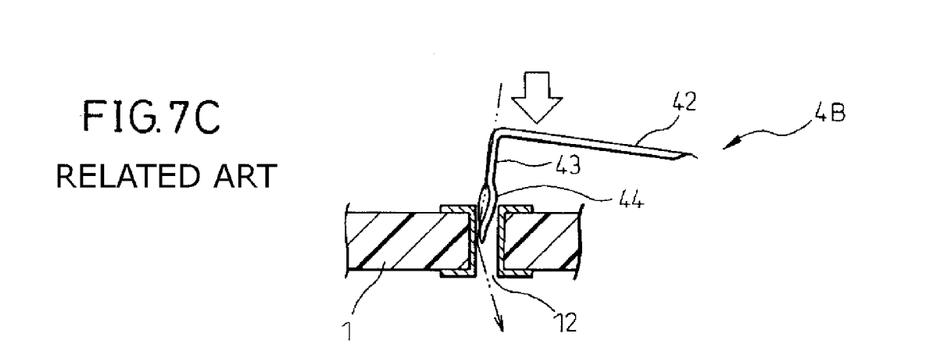
FIG. 7C is an explanatory view for explaining the problems when press-fitting the press-fit pins into the engagement holes from the state of FIG. 7B.

However, in the prior art, as shown in FIG. 7B, in the state with the free end part of a press-fit pin 44 provisionally inserted into an engagement hole 12, there was a deviation (difference in angle) between the axial line PL of the press-fit pin 44 and the axial line TL (vertical to the circuit board) of the engagement hole 12 (in this example, the engagement hole 12 is a through hole copper plated on the part on the circuit board and the inside circumference). That is, the axial line PL of the press-fit pin 44 is not vertical to the circuit board 1, so, as shown in FIG. 7C, if vertical direction force is applied all at once in this state, the force will disperse resulting in deformation of the shield plate 4B or force being applied rotating the press-fit pin 44 while the press-fit pin 44 is inserted into the engagement hole 12, so the press-fit pin 44 will buckle or other press-fit defects will occur and a problem will arise in quality.

To prevent this problem from arising, as the method of press-fitting a press-fit pin 44 into an engagement hole 12, there is the method of dividing the pressing force on the press-fit pin 44 into several parts to disperse the pushing force, but with this method, there was the problem that the time for press-fitting a press-fit pin 44 into an engagement hole 12 became longer and the number of circuit boards produced per unit time ended up falling.

Figures 8A, 8B, 8C:
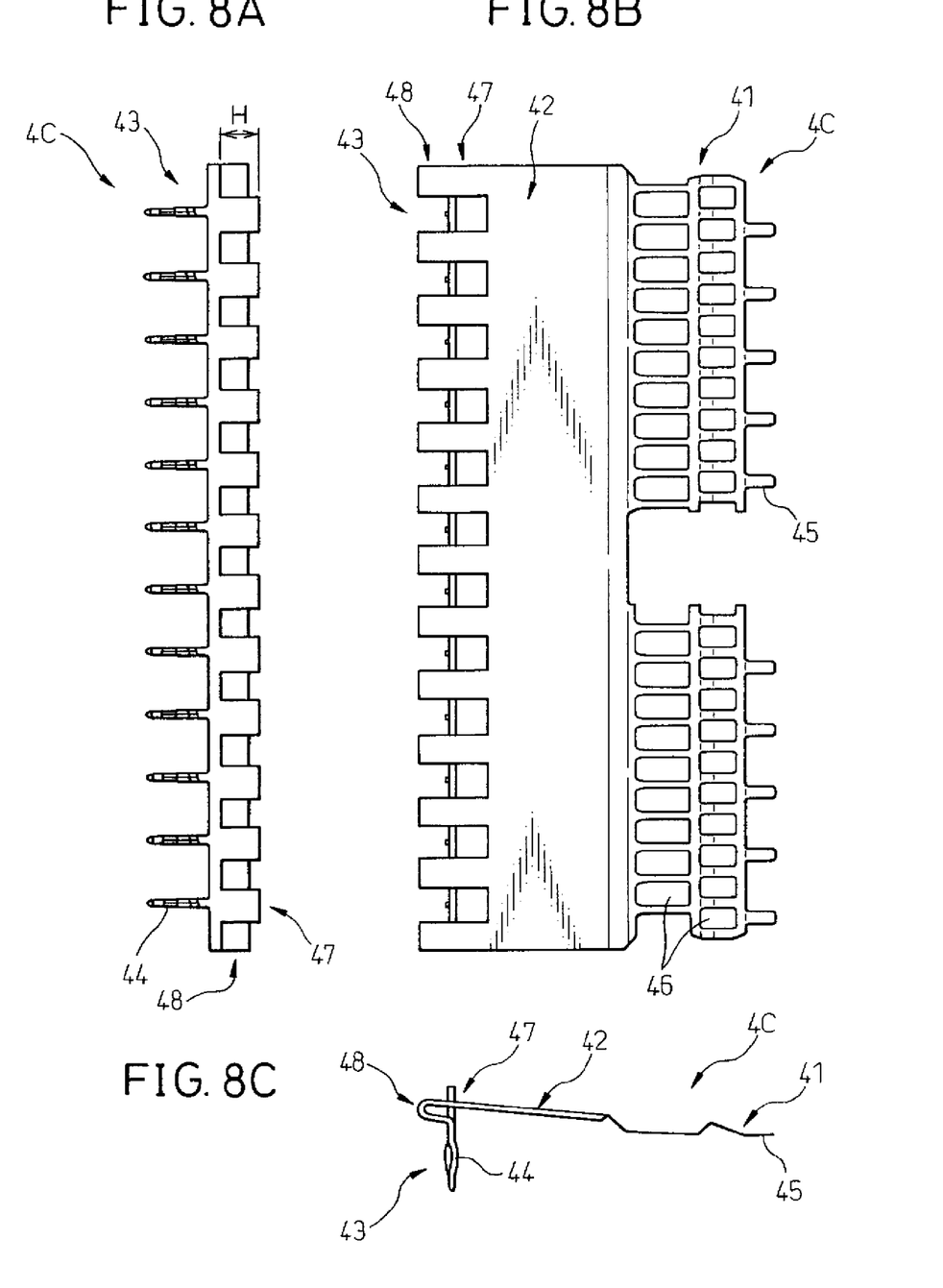
FIG. 8A is a front view showing the configuration of the shield plate according to an embodiment of the present invention attached between the shield plate engagement surface of a connector and a circuit board after the connector shown in FIG. 4 is attached to the circuit board.
FIG. 8B is a plan view of a shield plate shown in FIG. 8A.
FIG. 8C is a side view of the shield plate shown in FIG. 8A.

FIGS. 8A, 8B, and 8C are a front view, plan view, and side view showing the configuration of a shield plate 4C according to an embodiment of the present invention attached between a shield plate engagement surface 23 of a connector 2 and a circuit board 1 after the connector 2 shown in FIG. 4 is attached to the circuit board 1. The shield plate 4C is made of metal. The shield plate 4C of this embodiment is provided with an engagement part 41 engaged with the shield plate engagement surface 23 of the connector 2, a shield part 42 shielding the metal pins 29 sticking out from the circuit board 1, a mounting part 43 provided with press-fit pins 44 engaged by insertion into engagement holes 12 provided in the circuit board 1 (see FIG. 4), and pin support parts 47 and flexible parts 48 provided at the boundary part of the shield part 42 and mounting part 43.

The engagement part 41 has a smaller thickness. Engagement tabs 45 for insertion into engagement holes 28 running from the shield plate engagement surface 23 side of the connector 2 to the male connector connection surface 24 are provided at a free end of the engagement part 41. The distance between engagement tabs 45 is equal to the distance between engagement holes 28. Further, the engagement part 41 is provided at its center part with a plurality of holes 46 for lightening the weight of the connector 2 and securing flexibility of the engagement part 41. The tapered surface 23A of the connector 2 may also be provided with projections corresponding to these holes 46. Further, instead of the tapered surface 23A, the surface may be made flat.

The shield part 42 is a flat plate with a large thickness and is provided with an area covering the metal pins 29 sticking out from the circuit board 1. The mounting part 43 is provided perpendicular to the shield part 42. The free end side is provided with press-fit pins 44 at predetermined distances. The press-fit pins 44 have sharp free end parts, but the parts following the free end parts are formed as bulging parts. These bulging parts have widths larger than the diameters of the engagement holes 12 provided in the circuit board 1. Due to the bulging parts, the press-fit pins 44 can be fastened in the engagement holes 12.

The pin support parts 47 provided at the boundary of the shield part 42 and the mounting part 43 are configured to support the press-fit pins 44 vertical to the circuit board 1 in the state with the engagement part 41 engaged with the shield plate engagement surface 23 and with the shield part 42 inclined from the circuit board surface by a predetermined angle. This state is the state with the engagement part 41 engaged with the shield plate engagement surface 23 and with the free end parts of the press-fit pins 44 provisionally inserted into the engagement holes 12 in the circuit board 1. The shield part 42 is inclined with respect to the circuit board 1, but the pin support parts 47 are vertical to the circuit board 1. The flexible parts 48 are provided sticking out from the pin support parts 47. The flexible parts 48 are provided alternating with the pin support parts 47. The flexible parts 48, while explained later, are provided with the function of deforming by the pushing action so that the shield part 42 approaches the surface of the circuit board after the press-fit pins 44 are inserted into and engaged with the engagement holes 12 by the pushing action.

Here, a method of production of a shield plate 4C according to the present invention explained in FIGS. 8A to 8C will be explained using FIGS. 9A to 9D. Note that the methods of production of the engagement part 41 and the press-fit pins 44 of the mounting part 43 are the same as in the past, so their explanations will be omitted here. An example of the method of production of the pin support parts 47 and the flexible parts 48 after the engagement part 41 and the press-fit pins 44 of the mounting part 43 will be explained.

Figure 9A:
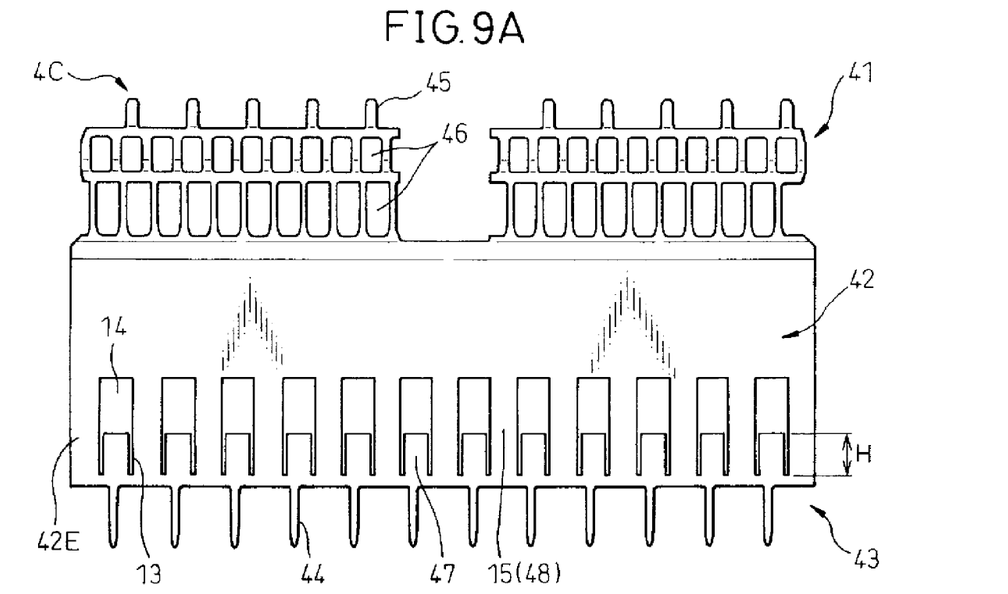
FIG. 9A is a plan view showing the state of the shield plate shown in FIG. 8B before working.

FIG. 9A shows a shield plate 4C before working. As shown in these figures, the pin support parts 47 and the flexible parts 48 are formed at an extended part 42E of the shield part 42 extending in the direction of the mounting part 43. The extended part 42E is first punched to form notched parts 13 and punched out holes 14. The notched parts 13 and the punched out holes 14 have widths larger than the widths of the press-fit pins 44 of the mounting part 43 and are provided at parts corresponding to the press-fit pins 44. Further, the parts surrounded by the notched parts 13 and the punched out holes 14 form the pin support parts 47. The connecting parts 15 sandwiched between the adjoining notched parts 13 and punched out holes 14 notched part 13 and the parts between the punched out holes 14 and the ends of the extended part 42E are bent to form the flexible parts 48.

Figure 9B:
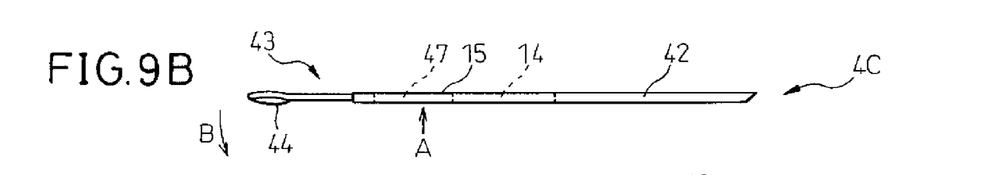
FIG. 9B is a side view of a shield plate shown in FIG. 9A.
Figure 9C:
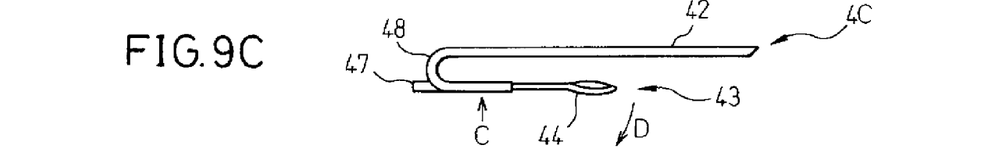
FIG. 9C is an explanatory view showing the process of folding back a connecting part of the shield plate from the state of FIG. 9B.
Figure 9D:
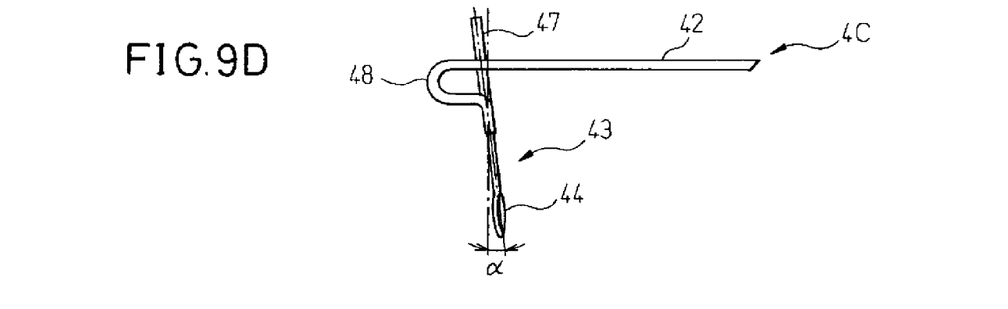
FIG. 9D is an explanatory view showing the process of bending the connecting part of the shield plate from the state of FIG. 9C.

FIG. 9B is a view of the shield plate 4C before working shown in FIG. 9A as seen from the side surface. When the shield plate 4C is made, first at the position shown by the arrow A, each connecting part 15 is folded back about 180° in the arrow B direction. This state is shown in FIG. 9C. Next, at the position shown by the arrow C in FIG. 9C, the mounting part 43 is bent in the arrow D direction. At this time, the angle by which the mounting part 43 is bent an angle of 90° minus $\alpha°$. This angle $\alpha$, as shown in FIG. 8C, is the angle so that the press-fit pins 44 are perpendicular to the circuit board 1 when the engagement tabs 45 of the shield plate 4C are inserted into the engagement holes 8 of the connector 2 and the shield part 42 is inserted at the shield plate engagement surface 23 of the connector 2 (not shown) by a predetermined angle $\alpha$ with respect to the circuit board 1.

Figure 10A:
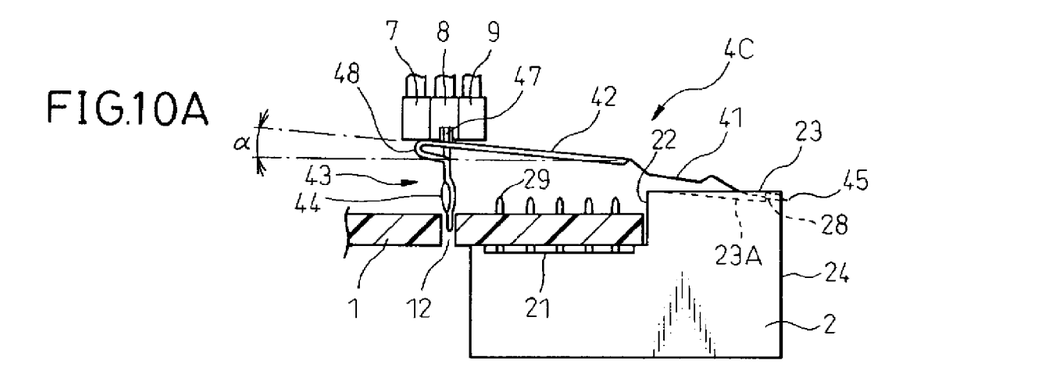
FIG. 10A is a view of the state where engagement tabs of a shield plate are inserted into engagement holes and free end parts of press-fit pins are provisionally inserted into engagement holes provided in a circuit board in the process of attaching the shield plate shown in FIG. 8C between a connector already attached to an end of the circuit board and the circuit board.
Figure 10B:
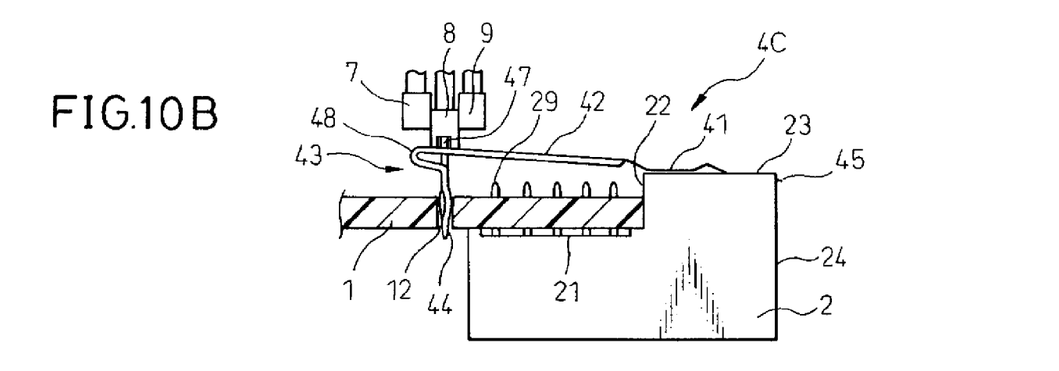
FIG. 10B is a view showing the process of press-fitting the press-fit pins into the circuit board by a pushing jig in the process of attaching the shield plate shown in FIG. 8C between a connector already attached to an end of the circuit board and the circuit board.
Figure 10C:
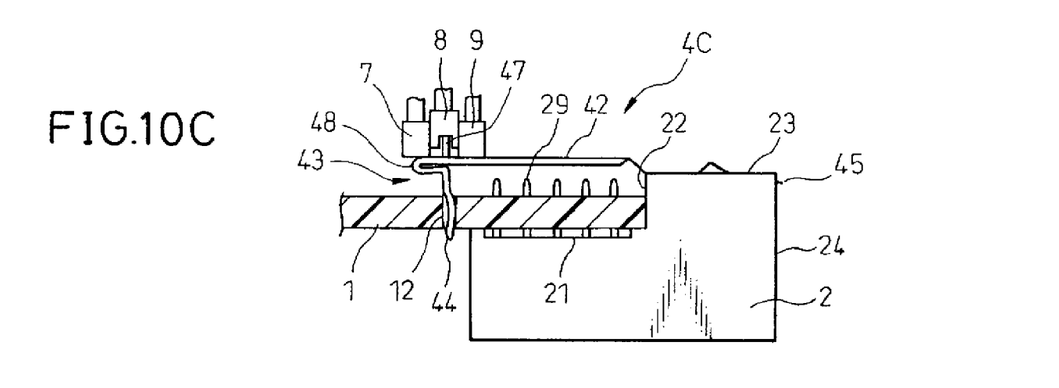
FIG. 10C is a view showing the process of press deforming the flexible part by the pushing jig in the process of attaching the shield plate shown in FIG. 8C between a connector already attached to an end of the circuit board and the circuit board.

FIGS. 10A to 10C shows the process of attaching the shield plate 4C shown in FIG. 8C between the connector 2 already attached to the end of the circuit board 1 and the circuit board 1. When attaching the shield plate 4C between the connector 2 and the circuit board 1, first the engagement tabs 45 of the free end part of the engagement part 41 of the shield plate 4C are inserted into the engagement holes 28 from the shield plate engagement surface 23 side. Next, the free end parts of the press-fit pins 44 provided at the end of the mounting part 43 of the shield plate 4C are temporarily inserted into the engagement holes 12 provided in the circuit board 1.

In this state, the angle formed by the shield part 42 of the shield plate 4C with the plane parallel to the circuit board 1 becomes $\alpha°$. Therefore, at this time, the press-fit pins 44 provided at the end of the mounting part 43 are perpendicular to the circuit board 1. The press-fit pins 44 are press-fit into the engagement holes 12 by positioning pushing jig parts 7, 8, and 9 above the press-fit pins 4 of the shield plate 4C. The pushing jig part 7, 8, and 9 are able to move independently for a pushing action. The pushing jig parts 7, 8, and 9 are set on the shield plate 4C in the state with the pushing jig part 8 positioned at the center holding the pin support parts 49.

Next, as shown in FIG. 10B, only the pushing jig part 8 among the pushing jig parts 7, 8, and 9 is made to descend to apply a pushing force to the pin support parts 47 and press-fit the press-fit pins 44 into the engagement holes 12 provided in the circuit board 1. At this time, the direction of the pushing force applied to the press-fit pins 44 is the same as the axial line directions of the press-fit pins 44, so no rotational force occurs at the press-fit pins 44. As a result, even if a strong pushing force is applied all at once to the press-fit pins 44, the press-fit pins 44 will be smoothly press-fit into the mounting holes 12. By suitably controlling the descent distance of the pushing jig part 8, the press-fit pins 44 can be fastened at suitable fastening positions in the mounting holes 12. Further, when press-fitting the press-fit pins 44 in the mounting holes 12, there is almost no change in shape at the shield part 42 or flexible parts 48.

After fastening this press-fit pins 44 into the mounting holes 12, as shown in FIG. 10C, the pushing jig parts 7 and 9 at the two sides of the pushing jig part 8 are made to descend to push against the flexible parts 48 and make the flexible parts 48 deform. Due to the deformation of the flexible parts 48, the shield part 42 is made to approach the metal pins 29 sticking out from the rear surface of the circuit board 1 and shield the same. By suitably controlling the descent distances of the pushing jig parts 7 and 9, the shield part 42 can be arranged at a suitable position with respect to the circuit board 1. In this case, preferably the pushing force by the pushing jig parts 7 and 9 against the flexible parts 48 is set smaller than the pushing force by the pushing jig part 8 against the press-fit pins 44 and excessive load on the press-fit pins 44 can be prevented.

Figure 11A:
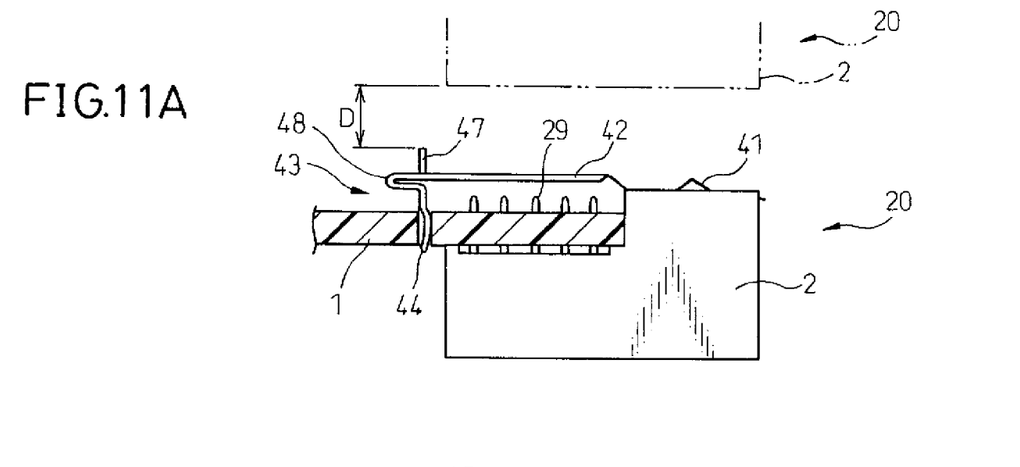
FIG. 11A is an explanatory view for explaining the relationship between the distance between plug-in units and the height of the pin support parts.

In the above way, the shield plate 4C according to the present invention can be suitably attached between the circuit board 1 and connector 2. Note that the height H of the pin support parts 47 shown in FIG. 8 and FIG. 9, as shown in FIG.

Figure 11B:
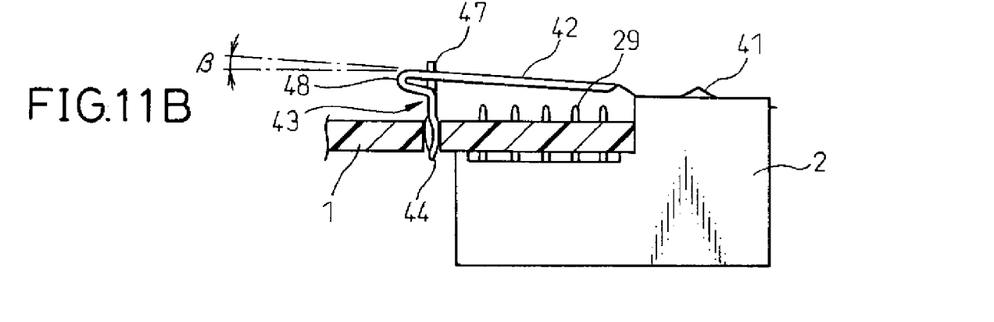
FIG. 11B is a partial enlarged cross-sectional view for explaining a mounting angle of a shield part of the shield plate with respect to the circuit board.

11A, may be set in accordance with the distance D between the connector 2 and pin support parts 47 of the plug-in units 20 held adjoining each other. Further, it is desirable to make the shield part 42 parallel to the circuit board 1 by deformation of the flexible parts 48 after fastening the press-fit pins 44. As shown in FIG. 11B, it is sufficient that it be inclined by exactly a predetermined angle β.

Figure 11C:
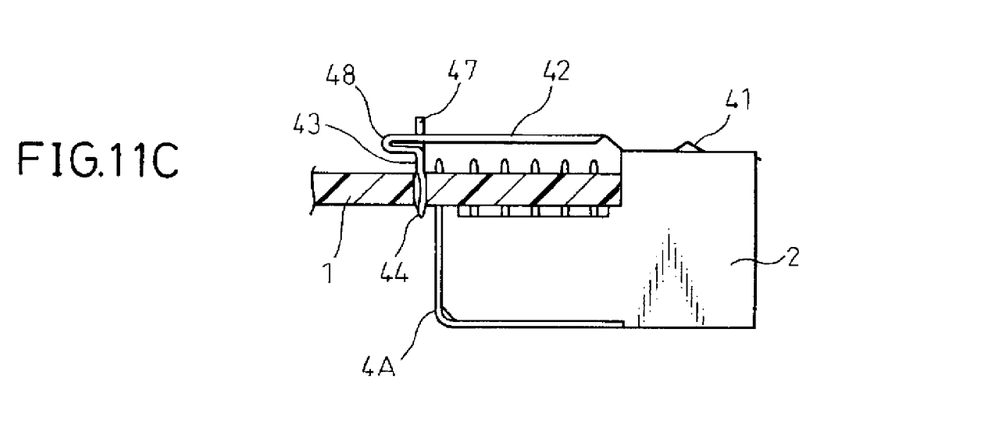
FIG. 11C is a partial enlarged cross-sectional view showing the state where a rear shield plate and also a front shield plate are attached between the connector and the circuit board.

Further, in the above explained plug-in unit 20, the explanation was given of the case where no front shield plate 4A explained in FIG. 2 was attached between the front circuit board 1 and the connector 2, but the configuration shown in FIG. 11C can be adopted when the front shield plate 4A is attached.

Figure 12A:
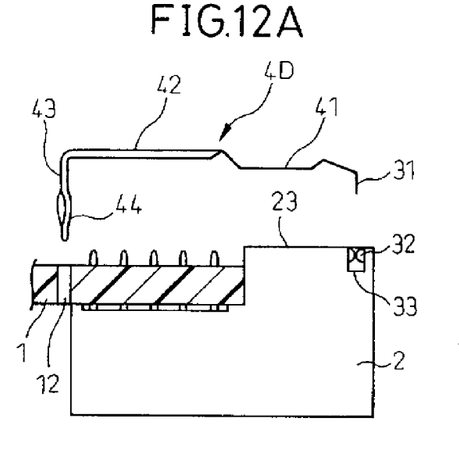
FIG. 12A is a partial enlarged cross-sectional view showing another embodiment of a shield plate according to the present invention.
Figure 12B:
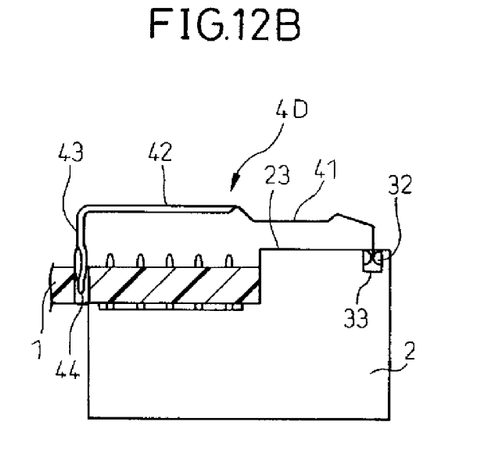
FIG. 12B is a partial enlarged cross-sectional view showing the top part where the shield plate of FIG. 12A is attached to the connector.

Still further, the present invention can be modified as follows. In the embodiment shown in FIGS. 12A, 12B, the free end part of the engagement part 41 of the shield plate 4B shown in FIG. 5 is bent vertically downward to form the bent part 31 and form the shield plate 4D. The shield plate engagement surface 23 of the connector 2 is provided with a recess 33 provided with a lock projection 32. The shield plate 4D can hold the shield part 42 horizontal when press-fitting the bent part 31 into the recess 33 and press-fitting the press-fit pins 44 into the engagement holes 12.

Figure 12C:
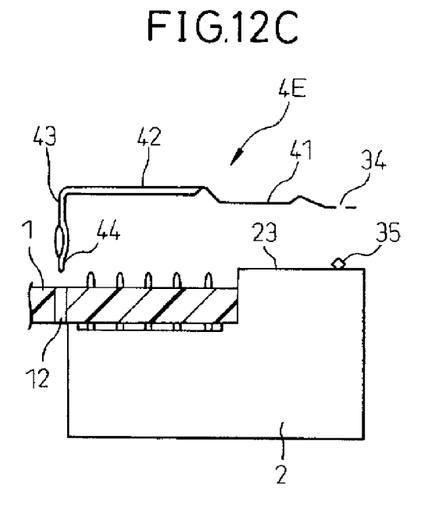
FIG. 12C is a partial enlarged cross-sectional view showing another embodiment of a shield plate according to the present invention.

Further, in the embodiment shown in FIG. 12C, the free end part of the engagement part 41 of the shield plate 4B shown in FIG. 5 is formed with engagement holes 34 and form the shield plate 4E. The shield plate engagement surface 23 of the connector 2 is provided with a lock projection 35. The shield plate 4E can hold the shield part 42 horizontal when press-fitting the lock projection 35 in the engagement hole 34 and press-fitting the press-fit pins 44 in the engagement holes 12.

Figure 12D:
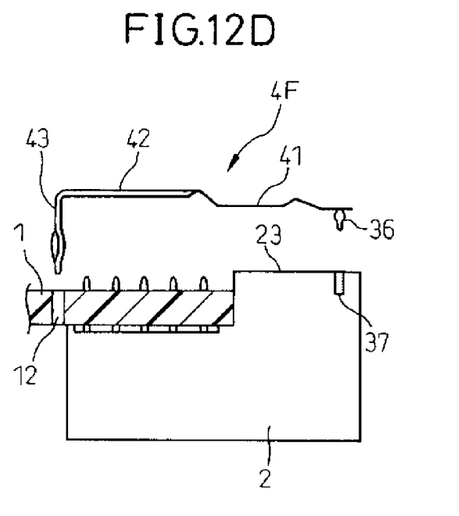
FIG. 12D is a partial enlarged cross-sectional view showing still another embodiment of a shield plate according to the present invention.

Further, in the embodiment shown in FIG. 12D, the free end part of the engagement part 41 of the shield plate 4B shown in FIG. 5 is formed with a lock projection 36 projecting out vertically downward and the shield plate engagement surface 23 of the connector 2 is provided with a recess 37 receiving a lock projection 36. The shield plate 4F can hold the shield part 42 horizontal when press-fitting the lock projection 36 in the recess 37 and press-fitting the press-fit pins 44 in the engagement holes 12.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A board-mounted type connector with a shield plate comprising:
   an insulating housing having a board mounting surface from which metal pins stick out to pass through mounting holes on a horizontal circuit board,
   a first surface of the insulating housing formed parallel to and spaced from said board mounting surface by a step difference of at least a thickness of said board, and
   a male connector connection surface having inside, female connector parts for electrical connection with said pins and adjoining said first surface, the shield plate made of metal and attached between said connector and board after the board-mounted type connector is mounted on said board, wherein
   an engagement part to be engaged with said first surface,
   a shield part for shielding said pins sticking out from said board,
   a mounting part provided with press-fit pins engaged by insertion into engagement holes provided in said board,
   pin support parts provided at a boundary between said shield part and said mounting part and supporting said press-fit pins vertically to said board when said engagement part is engaged with said first surface in a state with said shield part inclined with respect to said board surface, and
   flexible parts provided near said pin support parts and deforming by pushing action so that the shield part approaches the surface of said board after the press-fit pins are inserted into and engaged with the engagement holes by the pushing action,
   wherein said pin support parts are provided with pushing parts sticking out on extensions of base parts of said press-fit pins and given a pushing force when inserting said press-fit pins into said engagement holes, and said flexible parts are provided with curved parts bent to an angle of about 180° after sticking out from portions adjoining the base parts of said press-fit pins to opposite sides from said shield part and connecting to said pin support parts.

2. The board-mounted type connector as set forth in claim 1, wherein when a plurality of said circuit boards are arranged adjoining each other, the heights of said pushing parts are determined considering the distance between the circuit boards.

3. The board-mounted type connector as set forth in claim 1, wherein said pin support parts and flexible parts are made by punching a part extending from said shield part to form said pushing parts, then forming said curved parts by pressing.

4. The board-mounted type connector as set forth in claim 3, wherein said pin support parts and flexible parts are alternately provided.

5. The board-mounted type connector as set forth in any one of claims 1 to 4, wherein said engagement part is formed to a thickness thinner than said shield part.

6. The board-mounted type connector as set forth in claim 3, wherein said engagement part is provided with, at an end at an opposite side from said shield part, engagement tabs at predetermined distances for insertion into engagement holes provided at said first surface of said connector.

* * * * *